United States Patent
Omiya

(10) Patent No.: US 9,179,784 B2
(45) Date of Patent: Nov. 10, 2015

(54) APPARATUS, METHOD AND PROGRAM FOR DESIGNING SEATING ARRANGEMENT

(75) Inventor: Toshiyuki Omiya, Tokyo (JP)

(73) Assignee: P&W Solutions Co., Ltd., Tokyo (JP)

( * ) Notice: Subject to any disclaimer, the term of this patent is extended or adjusted under 35 U.S.C. 154(b) by 590 days.

(21) Appl. No.: 13/593,423

(22) Filed: Aug. 23, 2012

(65) Prior Publication Data

US 2013/0066599 A1 Mar. 14, 2013

(30) Foreign Application Priority Data

Sep. 9, 2011 (JP) .................................. 2011-196876

(51) Int. Cl.
| | | |
|---|---|---|
| *G06F 7/60* | (2006.01) | |
| *G06F 17/10* | (2006.01) | |
| *A47C 31/12* | (2006.01) | |
| *G06F 17/50* | (2006.01) | |
| *E04H 3/14* | (2006.01) | |
| *E04H 3/12* | (2006.01) | |

(52) U.S. Cl.
CPC .......... *A47C 31/126* (2013.01); *G06F 17/5004* (2013.01); *E04H 3/12* (2013.01); *E04H 2003/145* (2013.01)

(58) Field of Classification Search
CPC ............ G06F 17/5004; G06F 17/5036; G06F 17/5018; E04H 2003/145; E04H 3/10; G05B 17/02
USPC ............. 703/2; 297/217.3; 705/5, 8; 715/765
See application file for complete search history.

(56) References Cited

U.S. PATENT DOCUMENTS

| | | | | |
|---|---|---|---|---|
| 6,987,846 | B1 * | 1/2006 | James ...................... | 379/201.06 |
| 2002/0103681 | A1 * | 8/2002 | Tolis et al. ........................ | 705/5 |
| 2003/0101219 | A1 * | 5/2003 | Kondo et al. ................. | 709/204 |
| 2009/0187451 | A1 * | 7/2009 | Omiya .............................. | 705/8 |
| 2009/0187839 | A1 * | 7/2009 | Omiya .......................... | 715/765 |

FOREIGN PATENT DOCUMENTS

| | | | |
|---|---|---|---|
| JP | 2005-004386 | | 1/2005 |
| JP | 2005004386 | A * | 1/2005 |
| JP | 2005128930 | A * | 5/2005 |

OTHER PUBLICATIONS

Sasaki, Akira et al. "Allocation Management Device, Allocation Management Method, and Allocation Management Program", Jun. 10, 2003, English Translation of JP 2005-004386 A.*

* cited by examiner

*Primary Examiner* — Aniss Chad
*Assistant Examiner* — Cedric D Johnson
(74) *Attorney, Agent, or Firm* — SoCal IP Law Group LLP; Steven C. Sereboff; John E. Gunther

(57) ABSTRACT

A seating arrangement designing apparatus includes: a seating arrangement condition table that stores an attribute score indicating intensity of an attribute different for each position regarding a seating arrangement condition, in a data structure of contour lines; a staff condition table that stores tolerance in terms of the attribute of each of staff members; a point calculation unit that calculates a tolerance point indicating a degree of suitability of a certain seat arranged for any of the staff members, based on the attribute score and the tolerance, in a case of planning the seat to be arranged for the staff member; and a seating arrangement determination unit that determines seating arrangement, such that a total sum of the tolerance points for all the staff members satisfies a predetermined condition.

7 Claims, 3 Drawing Sheets

DEGREE OF AVOIDANCE OF PERSON A

SEATING ARRANGEMENT CONDITION TABLE

| SEATING ARRANGEMENT CONDITION ID | CONDITION NAME | CONTOUR LINE #1 (10 SCORES) | CONTOUR LINE #2 (8 SCORES) | ... |
|---|---|---|---|---|
| A01 | DEGREE OF EFFECTIVENESS OF AIR CONDITIONING | (X11,Y11), (X12,Y12), ... | (X21,Y21), (X22,Y22), ... | ... |
| B01 | DEGREE OF AVOIDANCE OF PERSON A | ... | ... | ... |
| B02 | DEGREE OF AVOIDANCE OF PERSON B | ... | ... | ... |
| C01 | SUPERVISOR SEAT | ... | ... | ... |
| C02 | PURCHASER'S-CALL ANSWERING TEAM | ... | ... | ... |
| ... | ... | ... | ... | ... |

FIG. 3A
DEGREE OF EFFECTIVENESS OF AIR CONDITIONING
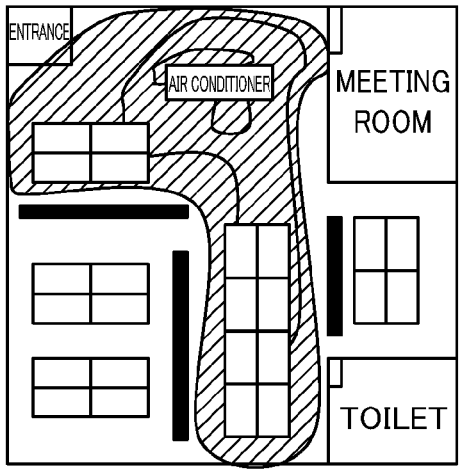
FIG. 3B
DEGREE OF AVOIDANCE OF PERSON A
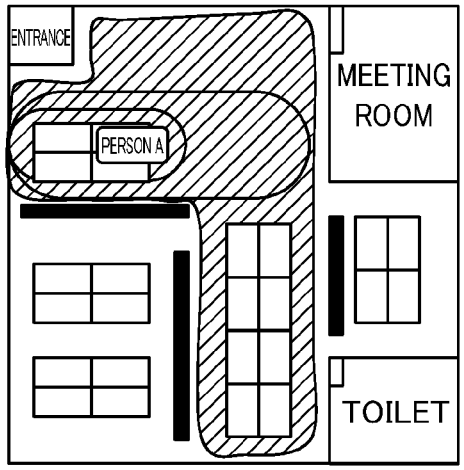
FIG. 3C
SUPERVISOR SEAT
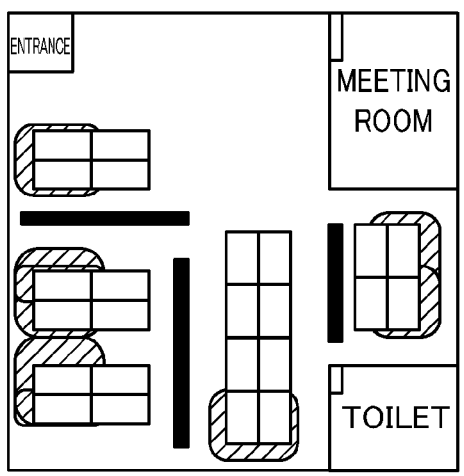
FIG. 3D
PURCHASER'S-CALL ANSWERING TEAM
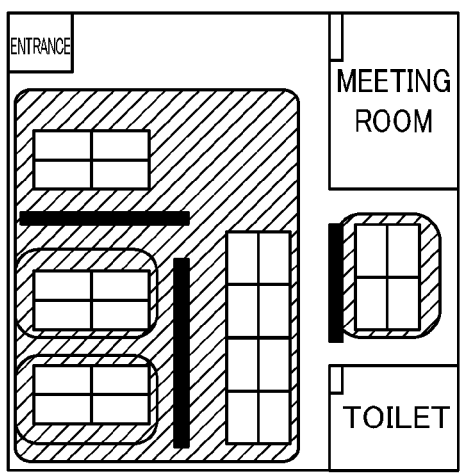
FIG. 4
STAFF CONDITION TABLE
| STAFF MEMBER ID \ SEATING ARRANGEMENT CONDITION | A01 | B01 | B02 | C01 | C02 | C03 | ... |
|---|---|---|---|---|---|---|---|
| 0001 | 10 | 7 | 1 | 0 | 10 | 10 | ... |
| 0002 | −5 | 2 | 6 | 10 | 10 | 0 | ... |
| ... | ... | ... | ... | ... | ... | ... | ... |

APPARATUS, METHOD AND PROGRAM FOR DESIGNING SEATING ARRANGEMENT

This application is based on and claims the benefit of priority from Japanese Patent Application No. 2011-196876, filed on 9 Sep. 2011, the content of which is incorporated herein by reference.

BACKGROUND OF THE INVENTION

1. Field of the Invention

The present invention relates to an apparatus, a method and a program, all of which determine seating arrangement of a plurality of seats for staff members.

2. Related Art

Conventionally, a design of seating arrangement for staff members is a significant factor for improvement or deterioration of business effectiveness at an office. Conditions that should be considered when designing seating arrangement is so diverse to include, for example, sensible temperatures by air conditioning, job titles, work contents, human relationships, and the like; therefore, it has not been easy to determine suitable seating arrangement in accordance with individual conditions.

In such a context, a seating arrangement management apparatus has been disclosed for the purpose of resolving contradictions among a plurality of seating arrangement rules based on a lot of seating arrangement requirements, and responding to the seating arrangement requirements (for example, see Japanese Unexamined Patent Application, Publication No. 2005-004386: Patent Document 1).

SUMMARY OF THE INVENTION

However, in the case of Patent Document 1, a requirement regarding seating is generally set for each staff member, and an attribute regarding the requirement is set for each seat. Judgment is then made as to whether the requirement for a seat arranged for each staff member is satisfied.

However, even if the requirement regarding the seating arrangement is satisfied, intensity of an attribute is different for each seat; therefore, tolerance (satisfaction) in terms of the seating arrangement may be different. In this case, since it has been difficult to judge difference of tolerance in terms of an attribute of a seat for each staff member, it has been difficult to compare the entire suitability in a state where the seats are arranged for all the staff members, with the suitability in another state where the seats are arranged in a different manner.

An object of the present invention is to provide a seating arrangement designing apparatus, a seating arrangement designing method, and a seating arrangement designing program, all of which are easily capable of setting intensity of attributes different for each seat, and easily capable of determining seating arrangement suitable for conditions.

According to the present invention, means as follows is provided for solving the problems.

A first aspect of the present invention is a seating arrangement designing apparatus that determines seating arrangement of a plurality of seats for staff members, the apparatus including: an attribute storage unit that stores an attribute score indicating intensity of an attribute different for each position regarding a seating arrangement condition, in a data structure of contour lines; a tolerance storage unit that stores tolerance in terms of the attribute of each of the staff members; a point calculation unit that calculates a tolerance point indicating a degree of suitability of a certain seat arranged for any of the staff members, based on the attribute score and the tolerance, the attribute score being identified based on a positional relationship between the seat thus arranged and the contour line in the seating arrangement condition, and the tolerance being in terms of the attribute of the staff member for whom the seat is arranged, in a case of planning the seat to be arranged for the staff member; and a seating arrangement determination unit that determines seating arrangement, such that a total sum of the tolerance points calculated by the point calculation unit for all staff members satisfies a predetermined condition.

According to such a configuration, the seating arrangement designing apparatus stores distribution of attribute scores in a data structure of contour lines, and calculates tolerance points, based on attribute scores of seats arranged for staff members, and tolerance that is set for each staff member in terms of attributes. The seating arrangement designing apparatus can determine suitable seating arrangement by the total sum of the tolerance points.

Therefore, the seating arrangement designing apparatus can easily set intensity of attributes different for each seat by using contour lines, and can easily determine seating arrangement suitable for conditions indicated by tolerance for each staff member.

A second aspect of the present invention is the seating arrangement designing apparatus as recited in the first aspect, in which the attribute storage unit stores each attribute score regarding a plurality of seating arrangement conditions in a common data structure of contour lines; the tolerance storage unit stores tolerance in terms of an attribute regarding each of the plurality of seating arrangement conditions; and the seating arrangement determination unit determines seating arrangement, such that a total sum of the tolerance points calculated by the point calculation unit for each of the plurality of seating arrangement conditions for all the staff members satisfies a predetermined condition.

Since operations of setting attributes by considering intensity of attributes for individual seats are complicated, and conditions of seating arrangement are diverse, it has been conventionally difficult to integrally set and apply the seating arrangement conditions, including priority among the plurality of conditions with different characteristics.

According to the second aspect of the present invention, the seating arrangement designing apparatus can define distribution of attribute scores regarding a plurality of seating arrangement conditions with different characteristics, in a common data structure of contour lines. Therefore, the seating arrangement designing apparatus can easily set intensity of attributes different for each seat, and can easily determine seating arrangement suitable for a plurality of conditions with different characteristics.

A third aspect of the present invention is the seating arrangement designing apparatus as recited in the first or second aspect, in which the predetermined condition is a case in which a total sum of the tolerance points calculated for each of the plurality of seating arrangement patterns is maximal.

According to such a configuration, the seating arrangement designing apparatus outputs, as a design result, a seating arrangement pattern in which the total sum of the tolerance points is maximal, among the seating arrangement patterns for which the tolerance points are calculated. Therefore, the seating arrangement designing apparatus can determine more suitable seating arrangement by selecting a seating arrangement pattern, in which the staff members are arranged for seats with higher tolerance being set to an attribute score.

A fourth aspect of the present invention is the seating arrangement designing apparatus as recited in any one of the first to third aspects, further including: a template storage unit that stores a template of a contour line regarding the seating arrangement condition; and an attribute input unit that accepts an input of correcting the template, and stores an attribute score indicated by a contour line thus corrected into the attribute storage unit.

According to such a configuration, by storing templates in advance, the seating arrangement designing apparatus can reduce the workload of the user, and can easily define distribution of attribute scores.

A fifth aspect of the present invention is the seating arrangement designing apparatus as recited in the fourth aspect, and in a case in which an attribute score regarding the seating arrangement condition indicates a degree of influence from a particular staff member, the point calculation unit identifies an attribute score in accordance with a position of a seat arranged for the particular staff member.

In a case in which an attribute score regarding a seating arrangement condition indicates a degree of influence from a particular staff member, it is necessary to move a contour line in accordance with the seating arrangement for the particular staff member.

According to the fifth aspect of the present invention, regardless of whichever seat is arranged for the particular staff member, the seating arrangement designing apparatus can identify an attribute score based on such a template, and does not need to set a contour line each time a seat is arranged for any particular staff member; therefore, the workload of the user can be reduced.

A sixth aspect of the present invention is a seating arrangement designing method performed by a computer to determine seating arrangement of a plurality of seats for staff members, the method including: an attribute storing step of storing an attribute score indicating intensity of an attribute different for each position regarding a seating arrangement condition, in a data structure of contour lines; a tolerance storing step of storing tolerance in terms of the attribute of each of the staff members; a point calculating step of calculating a tolerance point indicating a degree of suitability of a certain seat arranged for any of the staff members, based on the attribute score and the tolerance, the attribute score being identified based on a positional relationship between the seat thus arranged and the contour line in the seating arrangement condition, and the tolerance being in terms of the attribute of the staff member for whom the seat is arranged, in a case of planning the seat to be arranged for the staff member; and a seating arrangement determining step of determining seating arrangement, such that a total sum of the tolerance points calculated in the point calculating step for all staff members satisfies a predetermined condition.

According to such a configuration, effects similar to those of the first aspect can be expected by the computer performing the seating arrangement designing method.

A seventh aspect of the present invention is a seating arrangement designing program for determining seating arrangement of a plurality of seats for staff members, the program causing a computer to execute: an attribute storing step of storing an attribute score indicating intensity of an attribute different for each position regarding a seating arrangement condition, in a data structure of contour lines; a tolerance storing step of storing tolerance in terms of the attribute of each of the staff members; a point calculating step of calculating a tolerance point indicating a degree of suitability of a certain seat arranged for any of the staff members, based on the attribute score and the tolerance, the attribute score being identified based on a positional relationship between the seat thus arranged and the contour line in the seating arrangement condition, and the tolerance being in terms of the attribute of the staff member for whom the seat is arranged, in a case of planning the seat to be arranged for the staff member; and a seating arrangement determining step of determining seating arrangement, such that a total sum of the tolerance points calculated in the point calculating step for all staff members satisfies a predetermined condition.

According to such a configuration, effects similar to those of the first aspect can be expected by causing the computer to execute the seating arrangement designing program.

According to the present invention, it is possible to easily set intensity of attributes different for each seat, and to easily determine seating arrangement suitable for conditions.

BRIEF DESCRIPTION OF THE DRAWINGS

FIG. 3A is a diagram showing a first example of contour lines according to the embodiment of the present invention;

FIG. 3B is a diagram showing a second example of contour lines according to the embodiment of the present invention;

FIG. 3C is a diagram showing a third example of contour lines according to the embodiment of the present invention;

FIG. 3D is a diagram showing a fourth example of contour lines according to the embodiment of the present invention;

FIG. 4 is a diagram showing a staff condition table according to the embodiment of the present invention.

DETAILED DESCRIPTION OF THE INVENTION

Descriptions are hereinafter provided for an example of an embodiment of the present invention.

A seating arrangement designing apparatus 1 according to the present embodiment is an apparatus that determines seating arrangement of a plurality of seats for staff members at an office such as a contact center.

Figures 1, 2:
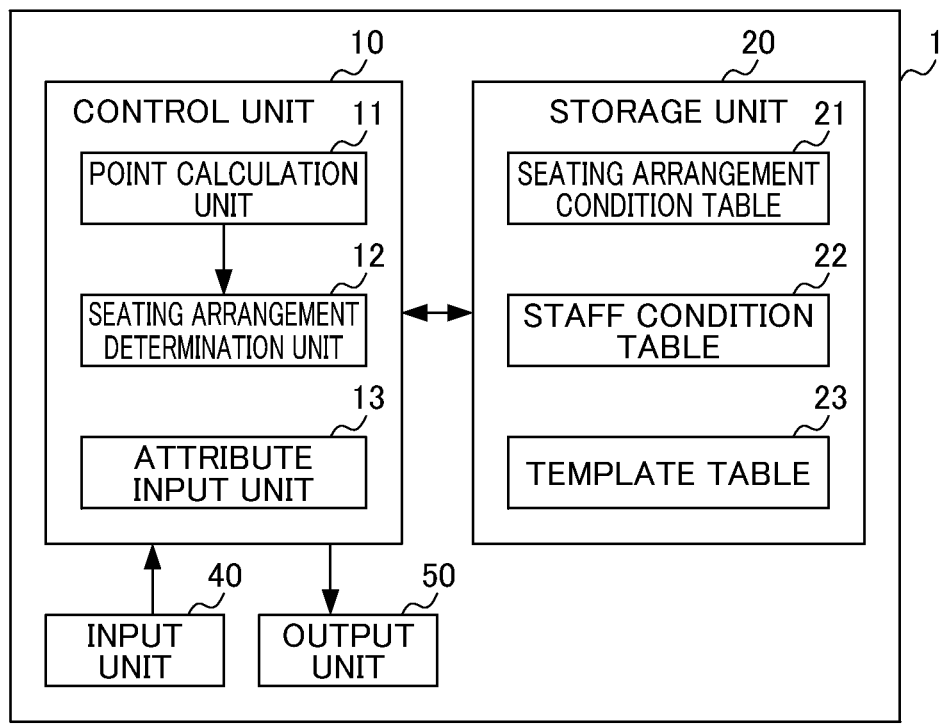
FIG. 1 is a block diagram showing a functional configuration of a seating arrangement designing apparatus according to an embodiment of the present invention.
FIG. 2 is a diagram showing a seating arrangement condition table according to the embodiment of the present invention.

FIG. 1 is a block diagram showing a functional configuration of the seating arrangement designing apparatus 1 according to the present embodiment.

The seating arrangement designing apparatus 1 includes a control unit 10, a storage unit 20, an input unit 40, and an output unit 50.

The control unit 10 controls the entirety of the seating arrangement designing apparatus 1, and appropriately reads and executes various programs stored in the storage unit 20, thereby collaborating with the aforementioned hardware units, and implementing various functions according to the present embodiment. The control unit 10 may be a central processing unit (CPU). Functions of each part provided to the control unit 10 will be described later.

The storage unit 20 is a storage area that stores various programs and a variety of data for causing a group of hardware units to function as the seating arrangement designing apparatus 1, in which the storage unit 20 may be a hard disk drive (HDD). More specifically, the storage unit 20 stores a program (a seating arrangement designing program) that is executed by the control unit 10 to implement various functions of the present embodiment; stores attribute score data (to be described later) into a seating arrangement condition table 21 (an attribute storage unit); stores tolerance data into a staff condition table 22 (a tolerance storage unit); and stores template data for attribute scores into a template table 23 (a template storage unit).

FIG. 2 is a diagram showing the seating arrangement condition table 21 according to the present embodiment.

Regarding a plurality of seating arrangement conditions, the seating arrangement condition table 21 stores attribute scores indicating attribute intensity different for each position, in a data structure of contour lines.

For example, attributes regarding a degree of effectiveness of air conditioning as seating arrangement conditions are distributed under the influence of a distance from an installation location of an air conditioner, a wind direction, an office layout, and the like; and effects (attribute scores) of the air conditioning are weakened in the order of a contour line #1 (for example, 10 scores), a contour line #2 (for example, 8 scores), and so on.

Similarly, an attribute score indicating a degree of avoidance of Person A, an attribute score indicating a degree of avoidance of Person B, an attribute score indicating a degree of suitability as a seat for a supervisor, an attribute score indicating a degree of suitability as a seat for a member of a purchaser's-call answering team, and the like are also defined by the contour lines #1, #2, and so on.

Here, a contour line is expressed by a combination of a plurality of pieces of coordinate data, and a closed curve continuously connecting such coordinates serves as the contour line indicating positions of an identical attribute score.

A plurality of attribute scores may be defined for the same type such as the attribute score indicating the degree of avoidance of Person A or Person B. Such attribute scores of the same type may be defined by an identical contour line.

The contour lines are generated by processing by the control unit 10 to be described later based on information input from a user, but the control unit 10 can also present an existing template to the user, and accept an input of correcting the template. The template table 23 according to the present embodiment stores templates of contour lines regarding seating arrangement conditions.

The template may have a fixed shape such as a concentric circle based on a reference position, but is not limited thereto, and may have a shape that dynamically transforms in accordance with a shape of an office, disposed objects, and the like.

FIG. 3 is a diagram showing an example of contour lines defined by the seating arrangement condition table 21 according to the present embodiment.

FIG. 3A shows contour lines of the attributes indicating degrees of effectiveness of the air conditioning; FIG. 3B shows contour lines of the attributes indicating degrees of avoidance of Person A; FIG. 3C shows contour lines of the attributes indicating degrees of suitability as seats for supervisors; and FIG. 3D shows contour lines of the attributes indicating degrees of suitability as seats for the purchaser's-call answering team.

The attribute scores indicated by the contour lines are appropriately set by considering the balance of tolerance points among the seating arrangement conditions.

Continuous values (for example, from 0 to 10) may be set as attribute scores by providing a plurality of contour lines, or two values (for example, 10 or 0) may be set as attribute scores by providing a single contour line (for example, an attribute score=10).

FIG. 4 is a diagram showing the staff condition table 22 according to the present embodiment.

The staff condition table 22 stores tolerance in terms of the attribute scores of each staff member.

For example, regarding a staff member with an ID "0001", tolerance shown as a seating arrangement condition "A01" (a degree of effectiveness of the air conditioning) is "10", and the tolerance shows that the staff member likes a seat with the air conditioning working well. On the other hand, regarding a staff member with an ID "0002", tolerance shown as the seating arrangement condition "A01" is "−5", and the tolerance shows that the staff member dislikes a seat with the air conditioning working well. As the absolute value of tolerance is increased, the degree of like and dislike in terms of the corresponding attribute is increased.

The tolerance can be set for a plurality of seating arrangement conditions for each staff member, and the tolerance is set at "0" for a seating arrangement condition that does not require consideration.

The input unit 40 is an interface device that accepts an input of an instruction by a user into the seating arrangement designing apparatus 1. The input unit 40 is configured by, for example, a keyboard, a mouse, a touch screen, and the like.

The output unit 50 includes a display unit that displays a screen for accepting an input of data from the user, and displays a screen for showing results of processing by the seating arrangement designing apparatus 1. The output unit 50 may include a display unit such as a cathode ray tube (CRT) display or a liquid crystal display (LCD), as well as other various output units such as a printer.

Next, detailed descriptions are provided for functions of the control unit 10.

The control unit 10 includes a point calculation unit 11, a seating arrangement determination unit 12, and an attribute input unit 13. Each of those units is a functional block that is implemented by executing the seating arrangement program.

In a case in which a certain seat is planned to be arranged for any one of the staff members for whom the seating arrangement is planned, the point calculation unit 11 firstly refers to the seating arrangement condition table 21, and identifies an attribute score, based on a positional relationship between the seat thus arranged and the contour line in the seating arrangement condition. Next, the point calculation unit 11 refers to the staff condition table 22, and extracts tolerance in terms of the attributes of the staff member for whom the seat was arranged. Based on the attribute score and the tolerance, the point calculation unit 11 calculates a tolerance point indicating a degree of suitability of the seat thus arranged for the staff member.

More specifically, the tolerance point is a value obtained by multiplying the attribute score and the tolerance together. In other words, as the values of the attribute score and the tolerance are both increased, the planned seating arrangement is more suitable. On the other hand, as the attribute score or the tolerance is decreased, or if the tolerance is a negative value, the planned seating arrangement is less suitable.

In a case in which an attribute score regarding a seating arrangement condition indicates a degree of influence from a particular staff member (for example, a degree of avoidance of Person A), the point calculation unit 11 identifies an attribute score in accordance with a position of the seating arrangement for the particular staff member (Person A) based on any one of the templates stored in the template table 23. As a result, even in a case in which a criterion of the seating arrangement condition fluctuates, the point calculation unit 11 can easily calculate a tolerance point with certain accuracy.

The seating arrangement determination unit 12 determines seating arrangement, such that the total sum of the tolerance points calculated by the point calculation unit 11 for all the staff members satisfies a predetermined condition. In a case in which there are a plurality of seating arrangement conditions, the seating arrangement determination unit 12 determines seating arrangement, such that the total sum of the total tolerance points calculated by the point calculation unit 11 for each of the plurality of seating arrangement conditions for all the staff members satisfies a predetermined condition.

Here, the predetermined condition is a case in which the total sum of the tolerance points calculated for each of the plurality of seating arrangement patterns planned as seating arrangement candidates is maximal. More specifically, after having calculated each tolerance point for all or some of the seating arrangement patterns, a seating arrangement pattern is determined such that the total tolerance points are maximal.

The attribute input unit 13 accepts an input from the user correcting a template via the input unit 40, and stores an attribute score indicated by the contour line thus corrected into the seating arrangement condition table 21.

Figure 5:
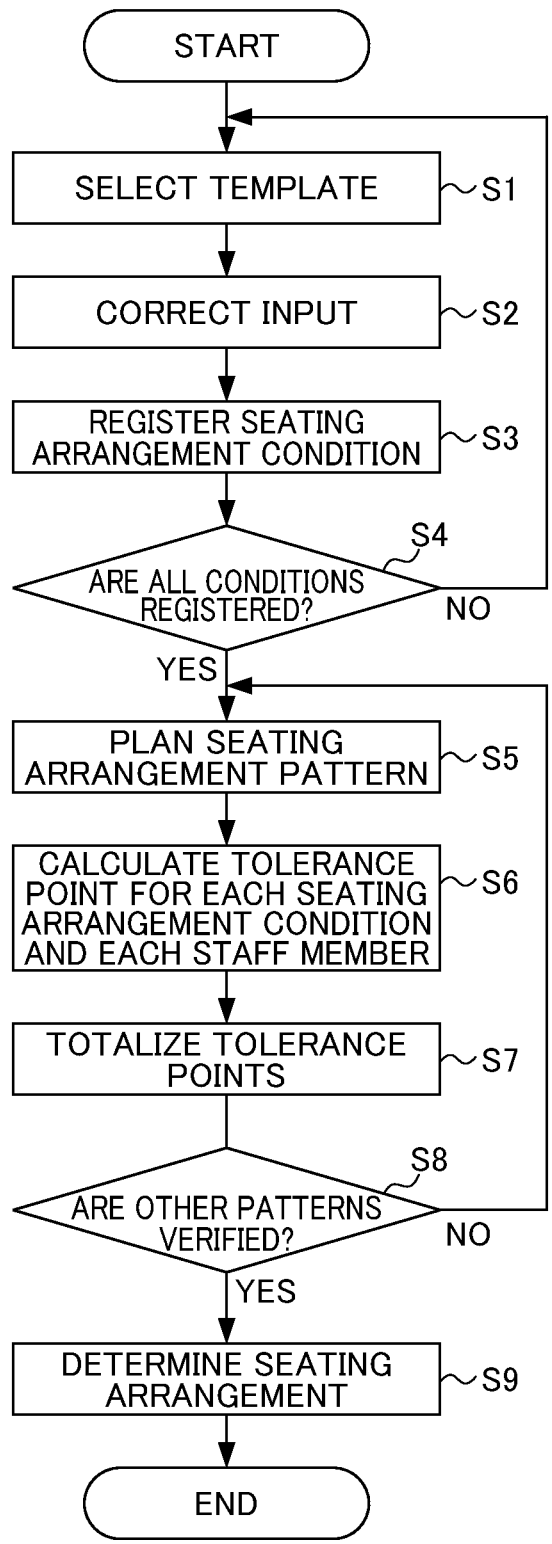
FIG. 5 is a flowchart showing processing according to the embodiment of the present invention.

FIG. 5 is a flowchart showing processing in the seating arrangement designing apparatus 1 according to the present embodiment. In Step S1, the control unit 10 accepts an input of selection from the user, and selects a template of a contour line from the template table 23.

In Step S2, the control unit 10 (the attribute input unit 13) accepts an input of correcting the template selected in Step S1 from the user, and updates the contour line data indicating the distribution of the attribute scores.

In Step S3, the control unit 10 (the attribute input unit 13) registers the contour line data updated in Step S2 with the seating arrangement condition table 21.

In Step S4, the control unit 10 determines whether the contour line data indicating the distribution of the attribute scores is registered for all the seating arrangement conditions; more specifically, the control unit 10 determines whether an instruction of terminating the setting of the seating arrangement conditions is accepted from the user. In a case in which the determination is YES, the processing advances to Step S5, and in a case in which the determination is NO, the processing returns to Step S1 and continues the setting of attribute scores for other seating arrangement conditions.

In Step S5, as one of the seating arrangement candidates, the control unit 10 plans one of seating arrangement patterns in which the seats are hypothetically arranged for all the staff members.

In Step S6, the control unit 10 (the point calculation unit 11) calculates a tolerance point for each seating arrangement condition and each staff member, based on the attribute score and the tolerance identified by the seating arrangement pattern planned in Step S5.

In Step S7, the control unit 10 totalizes the tolerance points for all the seating arrangement conditions and all the staff members calculated in Step S6, and stores the sum in association with the planned seating arrangement pattern.

In Step S8, the control unit 10 determines whether to verify other seating arrangement patterns. More specifically, in a case in which the processing is preset such that all possible combinations of seating arrangements are processed, or some combinations of seating arrangements are processed for the purpose of reducing the processing load, the control unit 10 determines whether there remains a pattern of which tolerance point is not calculated, among the seating arrangement patterns to be processed. In a case in which the determination is YES, the processing advances to Step S9, and in a case in which the determination is NO, the processing returns to Step S5 and continues the verification of other seating arrangement patterns.

In Step S9, the control unit 10 (the seating arrangement determination unit 12) extracts a seating arrangement pattern in which the total sum of the tolerance points obtained in Step S7 is maximal, and determines the seating arrangement pattern as a final result of designing seating arrangement.

According to the present embodiment as described above, the seating arrangement designing apparatus 1 stores distribution of attribute scores in a data structure of contour lines. The seating arrangement designing apparatus 1 can determine suitable seating arrangement by a total sum of tolerance points calculated based on attribute scores of seats arranged for staff members, and tolerance that is set for each staff member in terms of attributes. Therefore, the seating arrangement designing apparatus 1 can easily set intensity of attributes different for each seat by using contour lines, and can easily determine seating arrangement suitable for conditions indicated by tolerance for each staff member.

The seating arrangement designing apparatus 1 can define distribution of attribute scores regarding a plurality of seating arrangement conditions with different characteristics, in a common data structure of contour lines. Therefore, the seating arrangement designing apparatus 1 can easily set intensity of attributes different for each seat, and can easily determine seating arrangement suitable for a plurality of conditions with different characteristics.

At this time, the seating arrangement designing apparatus 1 outputs, as a design result, a seating arrangement pattern in which the total sum of the tolerance points is maximal, among the seating arrangement patterns for which the tolerance points are calculated. Therefore, the seating arrangement designing apparatus 1 can determine more suitable seating arrangement by selecting a seating arrangement pattern, in which the staff members are arranged for seats with higher tolerance being set to an attribute score of each seat.

By storing templates in advance, the seating arrangement designing apparatus 1 can reduce the workload of the user, and can easily define distribution of attribute scores.

In a case in which a contour line is required to be moved in accordance with arrangement of a particular staff member, regardless of whichever seat is arranged for the particular staff member, the seating arrangement designing apparatus 1 can identify an attribute score based on such a template. Therefore, the seating arrangement designing apparatus 1 does not need to set a contour line each time a seat is arranged for a particular staff member, and thus can reduce the workload of the user.

Although the embodiment of the present invention has been described above, the present invention is not limited to the aforementioned embodiment. The effects described in the embodiment merely list the most preferable effects that arise from the present invention, and the effects according to the present invention are not limited to those described in the embodiment.

The seating arrangement designing apparatus 1 may be any of various information processing apparatuses (computers) such as a server device or a personal computer (PC), and each of the aforementioned functions is implemented by software. In a case in which a function is implemented by software, a program composing the software is installed in an information processing apparatus. Such a program may be distributed by being recorded in a removable medium such as a CD-ROM, and may be distributed by being downloaded to an information processing apparatus through a network.

What is claimed is:

1. A seating arrangement designing apparatus that determines seating arrangement of a plurality of seats for staff members, the apparatus comprising:
    a processor;

a storage device coupled to the processor, the storage device storing:

a seating arrangement condition table containing, in a data structure of contour lines, an attribute score indicating an intensity of a first attribute that varies for different seat positions;

a staff condition table containing a tolerance to the first attribute for each of the staff members; and a seating arrangement designing program that, when executed by the processor, causes the seating arrangement designing apparatus to perform the actions including:

calculating a tolerance point indicating a degree of suitability of a certain seat assigned to one of the staff members, based on a tolerance of one staff member to the first attribute from the staff condition table and an attribute score value determined from a positional relationship between the certain seat and the contour lines in the seating arrangement condition table; and determining a seating arrangement, such that a total sum of the tolerance points calculated for all staff members satisfies a predetermined condition.

2. The seating arrangement designing apparatus according to claim 1, wherein the seating arrangement condition table stores respective attribute scores for a plurality of attributes including the first attribute, in a common data structure of contour lines, wherein the staff condition table stores tolerance to each of the plurality of attributes for each staff member, and wherein the actions performed further comprise determining a seating arrangement such that a total sum of the tolerance points calculated for each of the plurality of attributes for all the staff members satisfies the predetermined condition.

3. The seating arrangement designing apparatus according to claim 1, wherein the predetermined condition is a case in which a total sum of the tolerance points for all staff members is maximal.

4. The seating arrangement designing apparatus according to claim 1, wherein:

the storage device stores a template of a contour line regarding the first attribute; and the actions performed further include accepting an input to correct the template, and storing an attribute score indicated by a contour line thus corrected into the seating arrangement condition table.

5. The seating arrangement designing apparatus according to claim 4, wherein, in a case in which the attribute score is influenced by a location of a particular staff member, the actions performed further include defining the attribute score in accordance with a position of a seat assigned to the particular staff member.

6. A seating arrangement designing method performed by a computer to determine seating arrangement of a plurality of seats for staff members, the method comprising:

storing a seating arrangement condition table containing, in a data structure of contour lines, an attribute score indicating an intensity of a first attribute that varies for different seat positions;

storing a staff condition table containing a tolerance to the first attribute for each of the staff members;

calculating a tolerance point indicating a degree of suitability of a certain seat assigned to one of the staff members, based on a tolerance of the one staff member to the attribute from the staff condition table and an attribute score value determined from a positional relationship between the certain seat and the contour lines in the seating arrangement condition table; and determining a seating arrangement, such that a total sum of the tolerance points calculated for all staff members satisfies a predetermined condition.

7. A non-transitory computer-readable medium storing a seating arrangement designing program for determining seating arrangement of a plurality of seats for staff members, the program, when executed by a computer, causing the computer to perform actions comprising:

storing a seating arrangement condition table containing, in a data structure of contour lines, an attribute score indicating an intensity of a first attribute that varies for different seat positions;

storing a staff condition table containing a tolerance to the first attribute for each of the staff members;

calculating a tolerance point indicating a degree of suitability of a certain seat assigned to one of the staff members, based on a tolerance of the one staff member to the attribute from the staff condition table and an attribute score value determined from a positional relationship between the certain seat and the contour lines in the seating arrangement condition table; and determining a seating arrangement, such that a total sum of the tolerance points calculated for all staff members satisfies a predetermined condition.

* * * * *